United States Patent
Lee

(10) Patent No.: US 8,318,390 B2
(45) Date of Patent: Nov. 27, 2012

(54) HALFTONE MASK HAVING SHIELDING PARTS AND PLURAL OVERAPPING HALFTONE PATTERNS OF DIFFERENT WIDTHS

(75) Inventor: Ji No Lee, Goyang-Si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/243,936

(22) Filed: Sep. 23, 2011

(65) Prior Publication Data

US 2012/0015287 A1    Jan. 19, 2012

Related U.S. Application Data

(62) Division of application No. 13/109,443, filed on May 17, 2011, now Pat. No. 8,048,598, which is a division of application No. 12/572,983, filed on Oct. 2, 2009, now Pat. No. 7,968,257, which is a division of application No. 11/312,362, filed on Dec. 21, 2005, now Pat. No. 7,615,336.

(30) Foreign Application Priority Data

May 27, 2005 (KR) .......................... 10-2005-0045268

(51) Int. Cl.
*G03F 1/32* (2012.01)
(52) U.S. Cl. .......................................................... 430/5

(58) Field of Classification Search ........................ 430/5
See application file for complete search history.

(56) References Cited

U.S. PATENT DOCUMENTS

| 5,856,049 | A | 1/1999 | Lee |
| 6,391,499 | B1 | 5/2002 | Kim et al. |
| 7,968,257 | B2 * | 6/2011 | Lee ................................. 430/5 |
| 2001/0009745 | A1 | 7/2001 | Kim |
| 2003/0190556 | A1 | 10/2003 | Nakashima et al. |

FOREIGN PATENT DOCUMENTS

| EP | 1152292 B1 | 8/2004 |
| JP | 2005 24730 A | 1/2005 |
| KR | 10 2005 0016704 A | 2/2005 |

\* cited by examiner

*Primary Examiner* — Stephen Rosasco
*Assistant Examiner* — John S Ruggles
(74) *Attorney, Agent, or Firm* — Birch, Stewart, Kolasch & Birch, LLP

(57) ABSTRACT

A halftone mask includes shielding parts partially formed on a transparent substrate; a lower portion halftone transmission pattern partially formed between the shielding parts on the transparent substrate; and an upper potion halftone transmission pattern partially formed on the lower portion halftone transmission layer pattern, where the lower portion halftone transmission pattern is partially exposed in a gap between the shielding parts and the upper portion halftone transmission pattern.

5 Claims, 21 Drawing Sheets

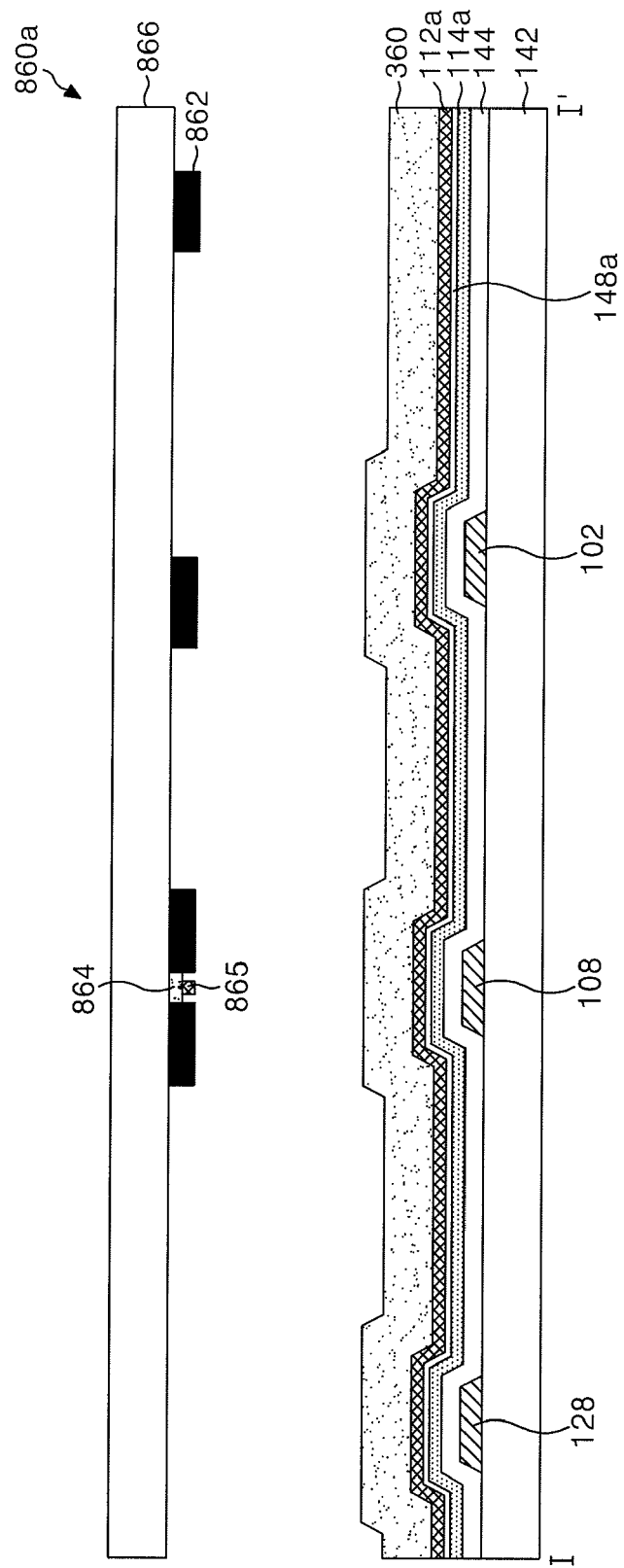

HALFTONE MASK HAVING SHIELDING PARTS AND PLURAL OVERAPPING HALFTONE PATTERNS OF DIFFERENT WIDTHS

This application is a Divisional of application Ser. No. 13/109,443 filed on May 17, 2011 now U.S. Pat. No. 8,048,598 issued Nov. 1, 2011 which was a Divisional Application of Ser. No. 12/572,983 filed Oct. 2, 2009, now U.S. Pat. No. 7,968,257 issued Jun. 28, 2011, which was a Divisional of application Ser. No. 11/312,362, filed on Dec. 21, 2005, now U.S. Pat. No. 7,615,336B2 issued Nov. 10, 2009, which patent claims priority under 35 U.S.C. §119(a) on Patent Application No. 10-2005-0045268 filed in Korea on May 27, 2005. The entire contents of each are hereby incorporated by reference.

BACKGROUND OF THE INVENTION

1. Field of the Invention

The present invention relates to a halftone mask, and more particularly to a halftone mask that is adaptive for preventing a residual photo-resist pattern, and a fabricating method thereof.

Further, the present invention relates to a fabricating method of a display device that is adaptive for improving uniformity and precision of signal and electrode pattern of the display device by using the halftone mask.

2. Description of the Related Art

A liquid crystal display device controls a light transmittance of a liquid crystal by controlling an electric field, thereby displaying a picture. The liquid crystal display device includes a liquid crystal display panel where liquid crystal cells are arranged in a matrix shape, and a driving circuit for driving the liquid crystal display panel.

The liquid crystal display panel includes a thin film transistor substrate, a color filter substrate, and a liquid crystal layer injected between the substrates.

The color filter substrate realizes the color of the liquid crystal cells, and includes a black matrix formed in a border part between color filters and liquid crystal cells, a common electrode for commonly supplying a reference voltage to the liquid crystal cells, and an alignment film spread thereover.

The thin film transistor substrate and the color filter substrate are bonded together after being made separately. A liquid crystal is injected and the bonded substrates are sealed.

In such a liquid crystal display panel, the fabricating process of the thin film transistor is complicated and is an important factor of the high manufacturing cost of the liquid crystal display panel because the thin film transistor substrate includes a semiconductor process and requires a plurality of mask processes. To solve this problem, the thin film transistor substrate has been developed in a direction to reduce the number of mask processes. This is because one mask process includes many processes such as a thin film deposition process, a cleaning process, a photolithography process, an etching process, a photo-resist stripping process, an inspection process, etc. Accordingly, a four-mask process has recently been on the rise, wherein the four-mask process is reduced by one mask process from the five-mask process which is a standard mask process of the thin film transistor substrate.

FIG. 1A is a cross-sectional view of a thin film transistor substrate which is made by adopting a four-mask process. Referring to FIG. 1A, the thin film transistor substrate includes a gate line 2 and a data line 4 which are formed on a lower substrate to cross each other with a gate insulating film 44 therebetween; a thin film transistor 6 formed at each crossing part thereof; and a pixel electrode 18 formed in a cell area which is provided by the crossing structure. In addition, the thin film transistor substrate includes a storage capacitor 20 formed in an overlapping part of the pixel electrode 18 and the pre-stage gate line 2; a gate pad connected to the gate line 2; and a data pad connected to the data line 4.

The thin film transistor 6 receives a pixel signal supplied to the data line 4 to be applied to the pixel electrode 18 in response to a scan signal supplied to the gate line 2. The thin film transistor 6 includes a gate electrode 8 connected to the gate line 2; a source electrode 10 connected to the data line 4; a drain electrode 12 connected to the pixel electrode 16; and an active layer which overlaps with the gate electrode 8 and forms a channel between the source electrode 10 and the drain electrode 12.

The active layer 14, which overlaps with the source electrode 10 and the drain electrode 12 and includes a channel part between the source electrode 10 and the drain electrode 12, is also formed to overlap with the data line 4, a data pad lower electrode 36 and a storage electrode 22. An ohmic contact layer 48 is further formed on the active layer 14 to be in ohmic contact with the data line 4, the source electrode 10, the drain electrode 12, the data pad lower electrode 36 and the storage electrode 22.

The pixel electrode 18 is connected to the drain electrode 12 of the thin film transistor 6 through a first contact hole 16 which penetrates a passivation film 50. The pixel electrode 18 generates a potential difference with a common electrode which is formed on an upper substrate (not shown), by applying the pixel signal on the pixel electrode 18. The potential difference causes a liquid crystal located between the thin film transistor substrate and the upper substrate to rotate by dielectric anisotropy so as to transmit the light, which is incident through the pixel electrode 18 from a light source (not shown), to the upper substrate.

The storage capacitor 20 includes a pre-stage gate line 2; a storage upper electrode 22 which overlaps with the gate line 2 with the gate insulating film 44, the active layer 14 and the ohmic contact layer 48 therebetween; and the pixel electrode 18 which overlaps with the storage upper electrode 22 with the passivation film 50 therebetween and is connected thereto through a second contact hole 24 which penetrates the passivation film 50. The storage capacitor 20 keeps the pixel signal applied on the pixel electrode 18 to be stable until the next pixel signal is charged.

The gate line 2 is connected to a gate driver (not shown) through a gate pad 26. The gate pad 26 includes a gate pad lower electrode 28 extending from the gate line 2, and a gate pad upper electrode 32 connected to the gate pad lower electrode 28 through a third contact hole 30 which penetrates the gate insulating film 44 and the passivation film 50.

The data line 4 is connected to a data driver (not shown) through a data pad 34. The data pad 34 includes a data pad lower electrode 36 extending from the data line 4; and a data pad upper electrode 40 connected to the data pad lower electrode 36 through a fourth contact hole 38 which penetrates the passivation film 50.

The thin film transistor which has such a configuration and is formed by the four-mask process simplifies the fabricating process by using a halftone mask. If the halftone mask is used, the data line 4, the source electrode 10, the drain electrode 12, the storage electrode 22, the data pad lower electrode 36, and a semiconductor pattern including the ohmic contact layer 48 and the active layer 14 can be formed by one mask process.

FIG. 1B is a cross-sectional view of a part of the thin film transistor substrate to illustrate the step of forming a photo-resist pattern by using a halftone mask in the fabricating process of the thin film transistor substrate shown in FIG. 1A.

A halftone mask 160 used herein includes a transparent quartz $SiO_2$ substrate 166; and a shielding layer 162 and a partial transmission layer 164 which are formed thereon. Herein, the shielding layer 162 is located in an area where the gate pattern is to be formed, to intercept ultraviolet ray UV, thereby leaving a first photo-resist pattern 168a after development. The partial transmission layer 164 is located in an area where the storage lower electrode is to be formed, to partially transmit the ultraviolet ray UV, thereby leaving a second photo-resist pattern 168b which is lower than the first photo-resist pattern 168a, after development. The shielding layer 162 is formed of a metal such as chrome Cr, chrome oxide CrOx, etc, and the partial transmission layer 164 is formed of molybdenum silicide MoSix, etc. When forming the first and second photo-resist patterns 168a, 168b, a stepped part of a border part of the first and second photo-resist patterns 168a, 168b is formed to have a gradient. Thus, a residual photo-resist material 169 is left even after going through an ashing process and an etching process. The photo-resist material 169 left in this way causes a pattern, which is to be formed later, to be formed non-uniformly. Therefore, the non-uniform pattern deteriorates the precision of the fabricating process of the display device.

Such a problem may also happen to another case of forming the photo-resist pattern PR by using the existing halftone mask 260 as shown in FIG. 2 as well as to the case of forming the thin film transistor substrate as described above.

FIG. 2 is a diagram showing a problem in more detail when the photo-resist pattern is formed by using the existing halftone mask.

Referring to FIG. 2, a part where a stepped difference of the photo-resist pattern is to be formed is a border part of a W1 area and a W2 area which corresponds to a border part of a shielding pattern part 262 and a halftone pattern part 264. However, if the photo-resist pattern PR is formed by using the existing halftone mask having the halftone pattern part 264 of single layer structure, the stepped difference part of the photo-resist pattern PR will have a gradient, thereby forming the W2 area where the stepped difference width is broadened. The stepped difference width W2 part of the photo-resist pattern broadly formed in this way will not be removed after the ashing process, thereby decreasing the uniformity and precision of the signal and electrode pattern to be formed.

SUMMARY OF THE INVENTION

Accordingly, it is an object of the present invention to provide a halftone mask that is adaptive for preventing a residual photo-resist pattern, and a fabricating method thereof.

Further, it is another object of the present invention to provide a fabricating method of a display device that is adaptive for improving uniformity and precision of signal and electrode patterns of the display device by using the halftone mask.

In order to achieve these and other objects of the invention, a halftone mask according to an aspect of the present invention includes a shielding pattern partially formed on a transparent substrate; a first halftone transmission pattern partially formed on the transparent substrate; and a second halftone transmission pattern formed on the first halftone transmission layer.

A fabricating method of a halftone mask according to another aspect of the present invention includes the steps of partially forming a shielding pattern on a transparent substrate; partially forming a first halftone transmission pattern on the transparent substrate; and forming a second halftone transmission pattern on the first halftone transmission layer.

A fabricating method of a halftone mask according to still another aspect of the present invention includes patterning a light shielding layer on a transparent substrate to partially expose the transparent substrate; forming a first halftone transmission material on the exposed transparent substrate; and forming a second halftone transmission material on the first halftone transmission pattern to partially expose the first halftone transmission pattern.

A fabricating method of a display device according to still another aspect of the present invention includes forming at least one to-be-patterned material layer on a substrate and forming a photo-resist layer on the to-be-patterned material layer; providing a halftone mask including a light transmission part for transmitting light, a shielding pattern for intercepting the light, a first halftone transmission pattern for transmitting the light of which the amount is less than the amount of an incident light, and a second halftone transmission pattern formed on the first halftone transmission layer that transmits the light of which the amount is less than the amount of an incident light; exposing the photo-resist layer to the light through the halftone mask; developing the photo-resist layer to form a photo-resist pattern on the substrate, wherein the photo-resist pattern has three different heights; and patterning the to-be-patterned layer by an etching process and an ashing process using the photo-resist pattern.

A halftone mask of a halftone mask according to another aspect of the present invention includes a shielding part partially formed on a transparent substrate; and a halftone transmission pattern partially formed on the transparent substrate, the transmission pattern has a step structure.

BRIEF DESCRIPTION OF THE DRAWINGS

These and other objects of the invention will be apparent from the following detailed description of the embodiments of the present invention with reference to the accompanying drawings, in which:

FIGS. 7A to 7F are diagrams showing the four-mask process of the thin film transistor substrate shown in FIGS. 6A and 6B.

DETAILED DESCRIPTION OF THE ILLUSTRATED EMBODIMENTS

Reference will now be made in detail to the preferred embodiments of the present invention, examples of which are illustrated in the accompanying drawings.

FIGS. 3 to 5H are diagrams for explaining a halftone mask according to an embodiment of the present invention. An area shown in FIGS. 3 to 5H is not the whole halftone mask, but is an area where there is a halftone transmission part with a step structure. Accordingly, the other areas, such as the shielding part and a full exposure area, can be changed in accordance with a structure of a mask used in the process.

Figure 1A:
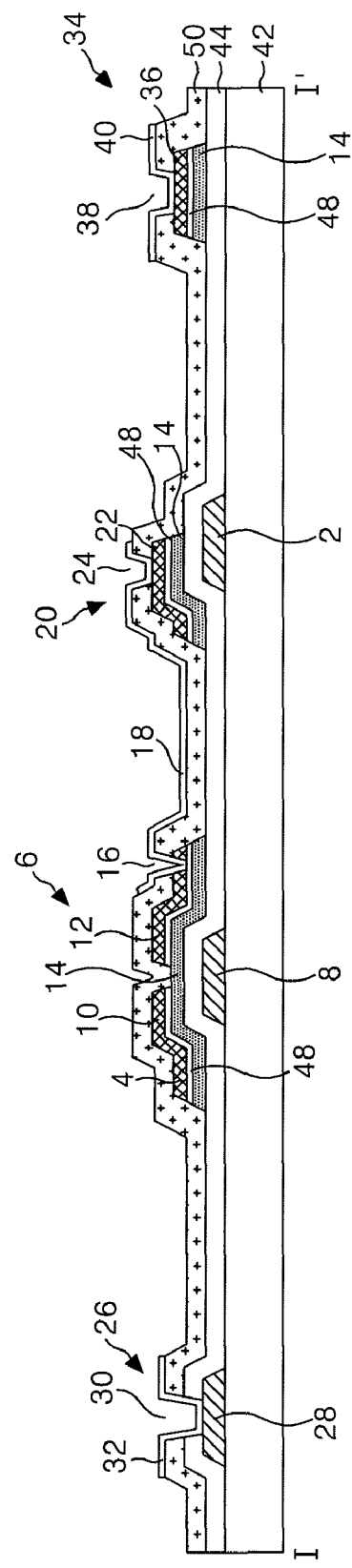
FIGS. 1A and 1B show a cross-sectional view of a thin film transistor substrate of the related art, and show a part made by using a halftone mask when fabricating the related art thin film transistor substrate.
Figure 1B:
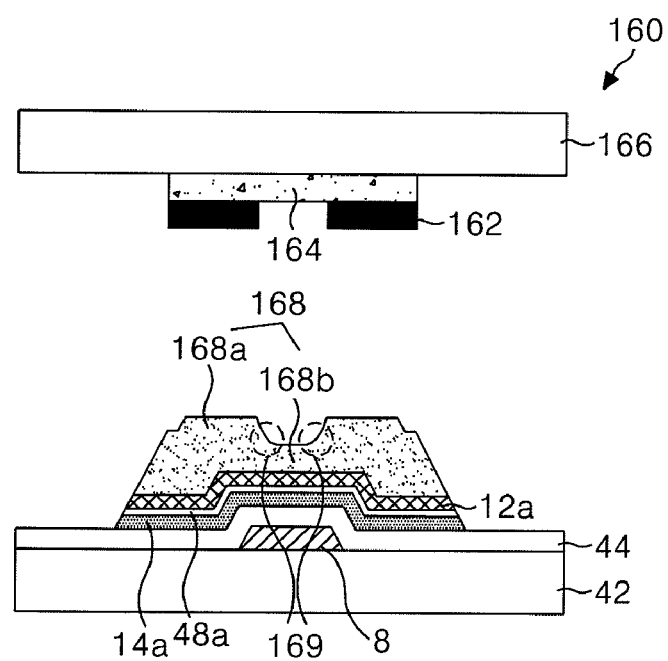
Figure 2:
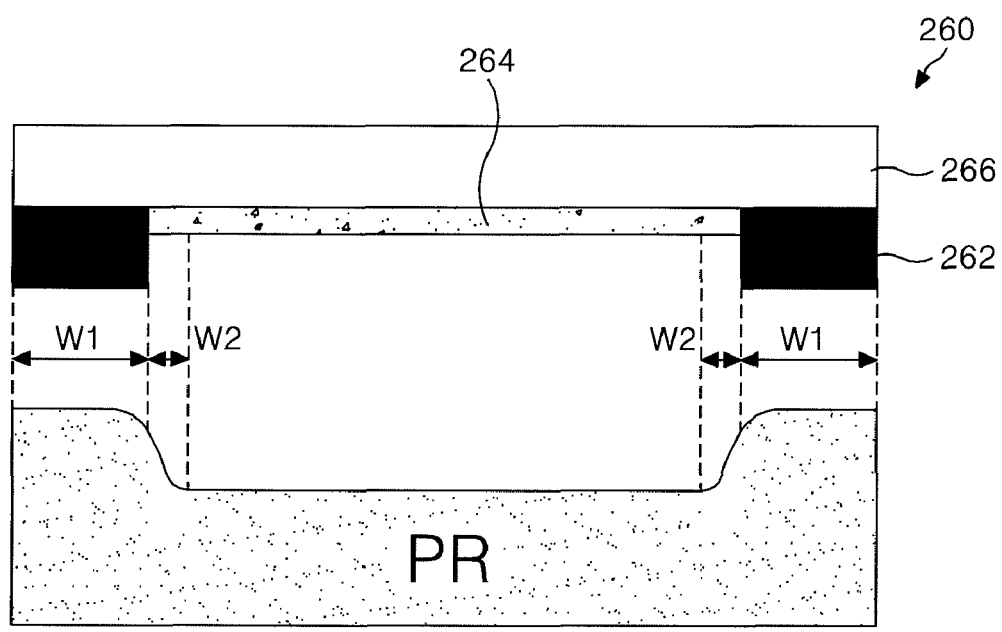
FIG. 2 is a diagram showing a photo-resist pattern formed by using a halftone mask of the related art.
Figure 3:
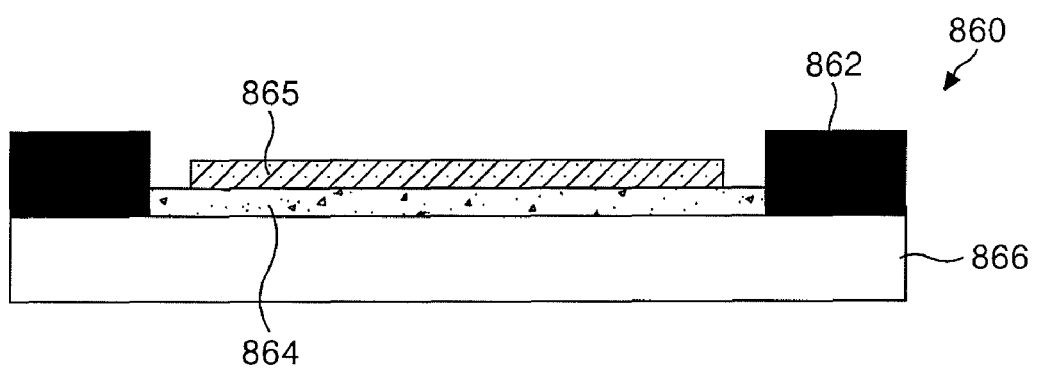
FIG. 3 is a diagram showing a cross-sectional view of a halftone mask according to an embodiment of the present invention.

Referring to FIG. 3, a halftone mask 860 includes a shielding pattern 862 partially formed on a transparent substrate 866; a first halftone transmission pattern 864 partially formed on the transparent substrate; and a second halftone transmission pattern 865 formed on the first halftone transmission pattern 864.

Figure 4:
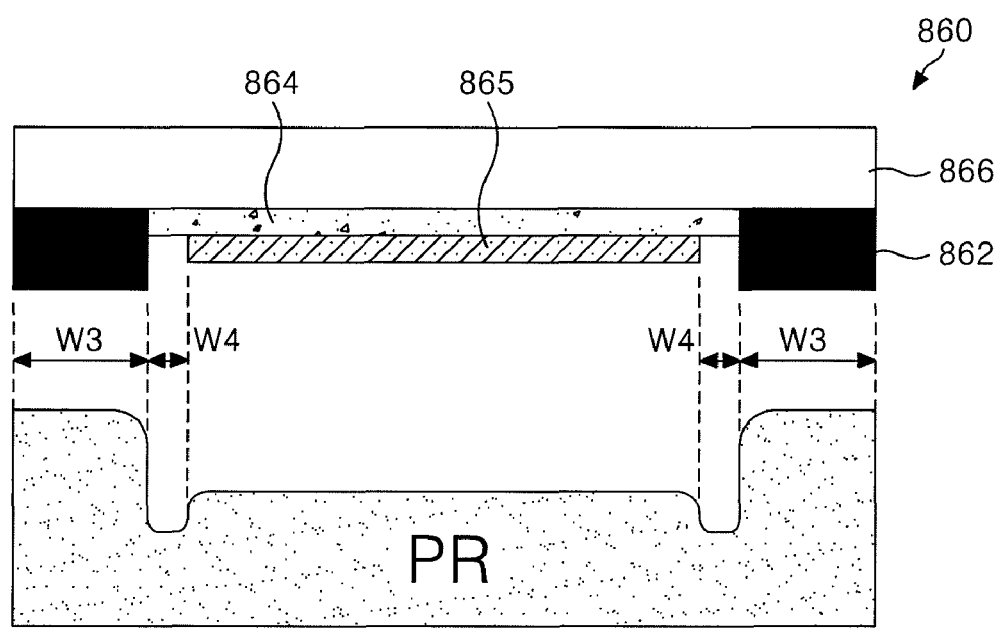
FIG. 4 is a diagram showing a photo-resist pattern formed by using the halftone mask shown in FIG. 3.

Herein, the transparent substrate 866 is formed of transparent quartz $SiO_2$. The shielding pattern 862 is formed of a metal such as chrome, chrome oxide, etc, and the first and second halftone transmission patterns 864, 865 are formed of chrome oxide, molybdenum silicide, tantalum group, etc. Herein, the shielding pattern 862 has a lower light transmittance than the first and second halftone transmission patterns 864, 865. Further, the second halftone transmission pattern 865 is formed on the first halftone transmission pattern 864 to be narrower than the first halftone transmission pattern 864. In addition, the light transmittance of the halftone transmission layer is determined in accordance with a composition ratio and a thickness of a material constituting the first and second halftone transmission patterns 864, 865. However, a part where the first halftone transmission pattern 864 overlaps with the second halftone transmission pattern 865 has a lower light transmittance than a part which is formed from only the first halftone transmission pattern 864. For example, it is assumed that a halftone mask is fabricated so that the transmittance of the first halftone transmission pattern 864 is 50% and the transmittance of the second halftone transmission pattern 865 is 20%. Then, the transmittance of the part where the first halftone transmission pattern 864 overlaps with the second halftone transmission pattern 865 becomes 10% (10=0.5*0.2*1/100), and the transmittance of the part which is formed from only the first halftone transmission pattern 864 at the gap between the second halftone transmission pattern 865 and the shielding pattern 862 becomes 50%. Accordingly, as shown in FIG. 4, the photo-resist PR pattern formed through the first halftone transmission pattern 864 at the gap (W4 area) is lower than the photo-resist PR pattern formed through the part where the first halftone transmission pattern 864 overlaps with the second halftone transmission pattern 865. Accordingly, a border part of the photo-resist PR pattern formed through the part where the first halftone transmission pattern 864 overlaps with the second halftone transmission pattern 865 and the photo-resist PR pattern formed only through the first halftone transmission pattern 864, i.e., a border part of the W4 area and the W3 area, has a stepped difference with a steeper gradient. Accordingly, it can solve the problem generated due to a gentle gradient of the stepped photo-resist pattern is formed with a gentle gradient when using the related art halftone mask which includes the halftone transmission part having single structure. That is to say, if the halftone mask according to an embodiment of the present invention is used, no residual photo-resist material is left at the border even after going through an ashing process and an etching process because the stepped difference of the border part of the W4 area and the W3 area has a steeper gradient. Accordingly, the uniformity of the signal and electrode pattern is improved and the precision of the fabricating process of the display device is also improved.

The light transmittance of the first halftone transmission pattern 864 and the transmittance of the second halftone transmission pattern 865 can be formed to be the same, or they can be formed to be different as described in the above example. In addition, the first halftone transmission pattern 864 and the second halftone transmission pattern 865 can be made of the same or different materials and may be integrally formed. By controlling the height and materials of the first halftone transmission pattern 864 and the second halftone transmission pattern 865, a desired depth of the photo-resist pattern at the W4 area can be obtained.

Figure 5A:
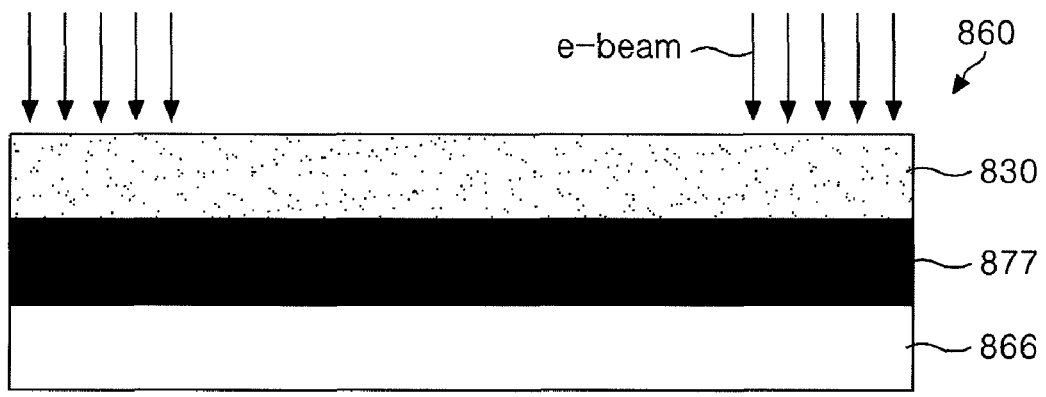
FIGS. 5A to 5H are diagrams showing a fabricating process of the halftone mask shown in FIG. 3.
Figure 5B:
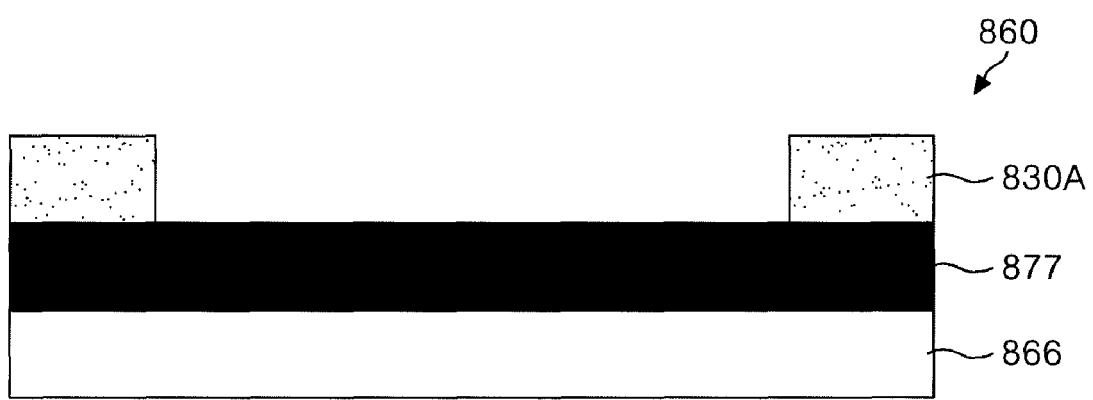

The fabricating process of the halftone mask 860 according to an embodiment of the present invention will be described with reference to FIGS. 5A to 5H. First, as shown in FIG. 5A, a shielding layer forming material and a resist material are deposited on a transparent substrate 866 by a method such as spin coating, sputtering, etc. Accordingly, a light shielding layer 877 and a first resist layer 830 are formed. Herein, a resist material is an e-beam resist material which reacts to the e-beam, and is a negative type that an area to which the e-beam is not irradiated is removed by a developing solution. When the first resist layer 830 is developed after the e-beam is selectively irradiated to the first resist layer 830 formed in this way, a first resist pattern 830a is formed, as shown in FIG. 5B. In addition, the shielding layer forming material is exposed in a part to which the e-beam is not irradiated so that the resist material is removed by the developing solution.

Figure 5C:
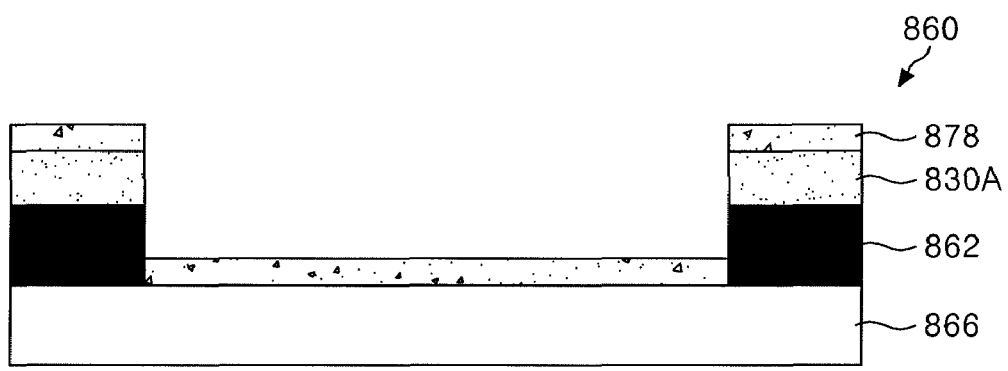
Figure 5D:
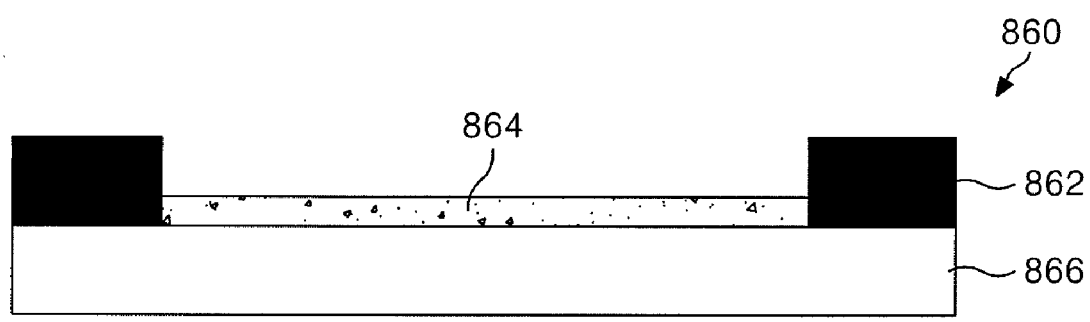

The exposed shielding layer forming material is removed by a wet etching by using the first resist pattern 830a as a mask. Subsequently, as shown in FIG. 5C, the first halftone transmission material is spread to form a first halftone transmission layer 878. Then, the first resist pattern 830a and the first halftone transmission material thereon are simultaneously removed by a lift-off process, thereby forming the first halftone transmission pattern 864, as shown in FIG. 5D.

Figure 5E:
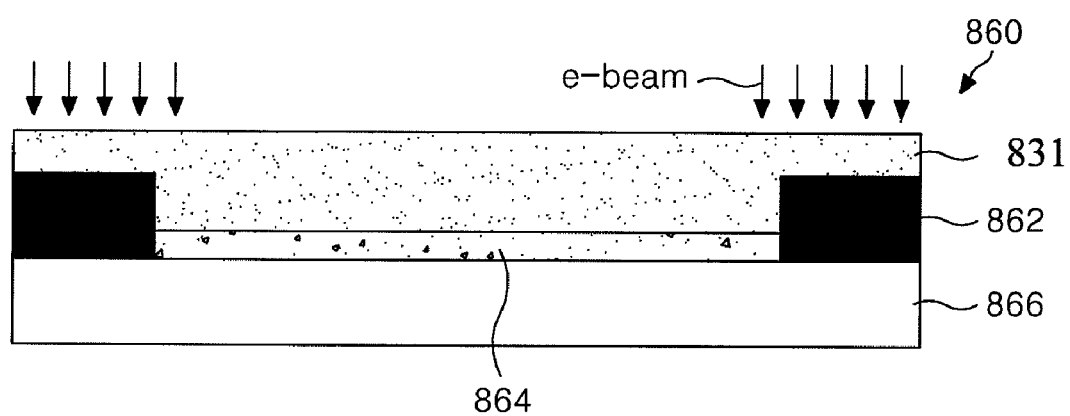
Figure 5F:
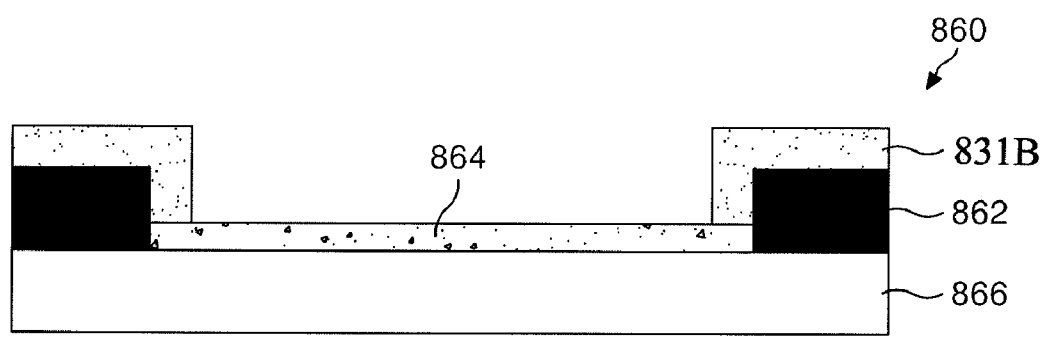
Figure 5G:
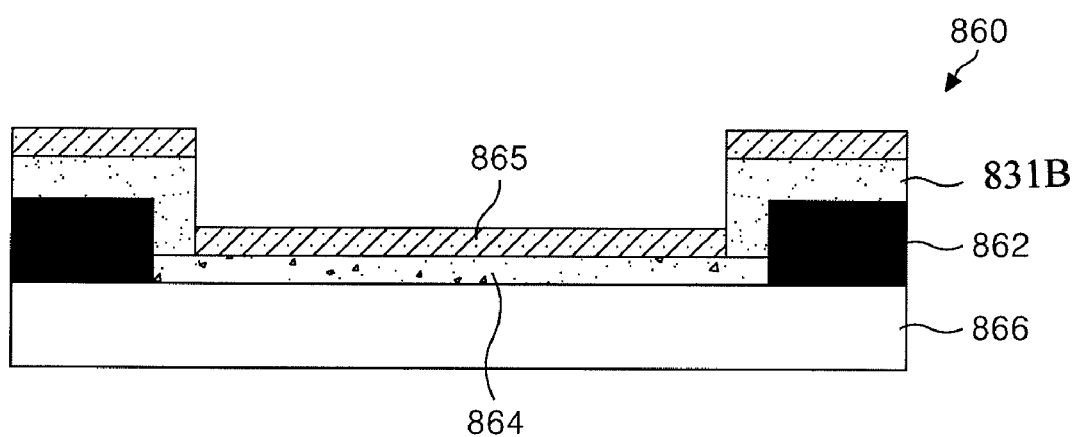
Figure 5H:
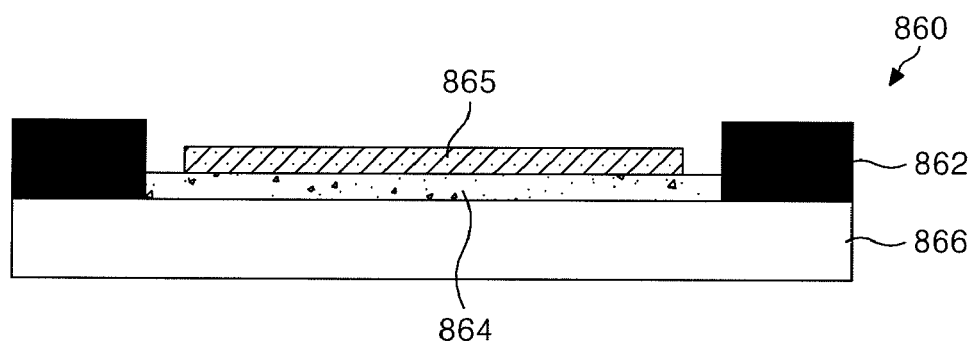

After spreading a second resist material layer 831 by a method such as spin coating, sputtering, etc on the substrate where the first halftone transmission pattern 864 is formed, as shown in FIG. 5E, the e-beam is selectively irradiated. When the development is performed after irradiating the e-beam as above, a second resist pattern 831b is formed, as shown in FIG. 5F. Subsequently, a second halftone transmission material 879 is spread, as shown in FIG. 5G. The second resist pattern 831b and the second halftone transmission material thereon are removed by the lift-off process, thereby forming the second halftone transmission pattern 865, as shown in FIG. 5H. Accordingly, the halftone transmission pattern according to an embodiment of the present invention is formed as a step structure including the first and second halftone transmission patterns 864, 865. The resist material can also be a material that reacts to light besides the material that reacts to the e-beam.

An effect generated by using the halftone mask including the halftone transmission pattern of the step structure according to an embodiment of the present invention will be clearly shown in a process of fabricating the thin film transistor substrate as follows.

Figure 6A:
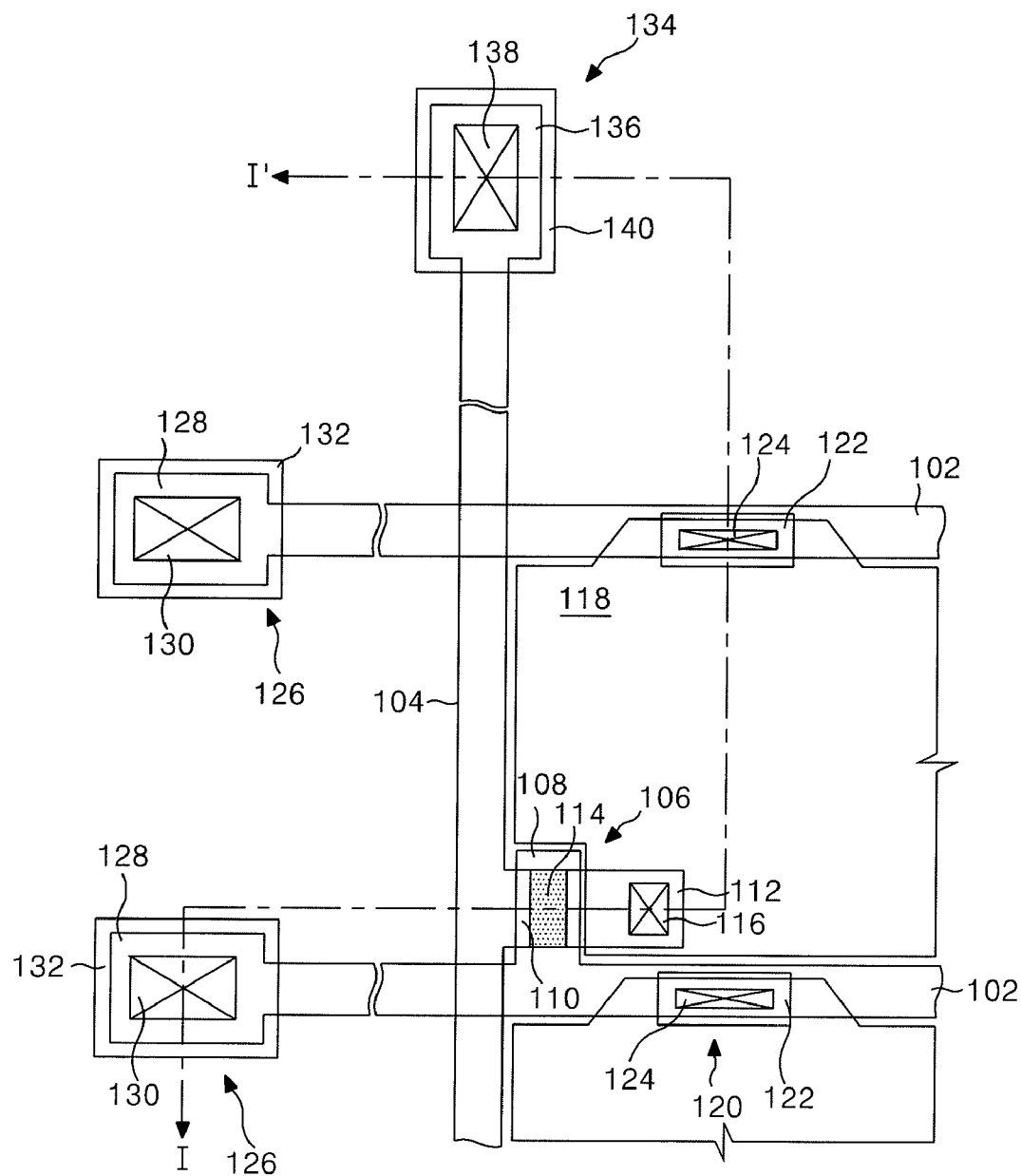
FIGS. 6A and 6B are diagrams showing a plane structure and a cross sectional structure of the thin film transistor substrate which is fabricated by a four-mask process by using the halftone mask according to an embodiment of the present invention.
Figure 6B:
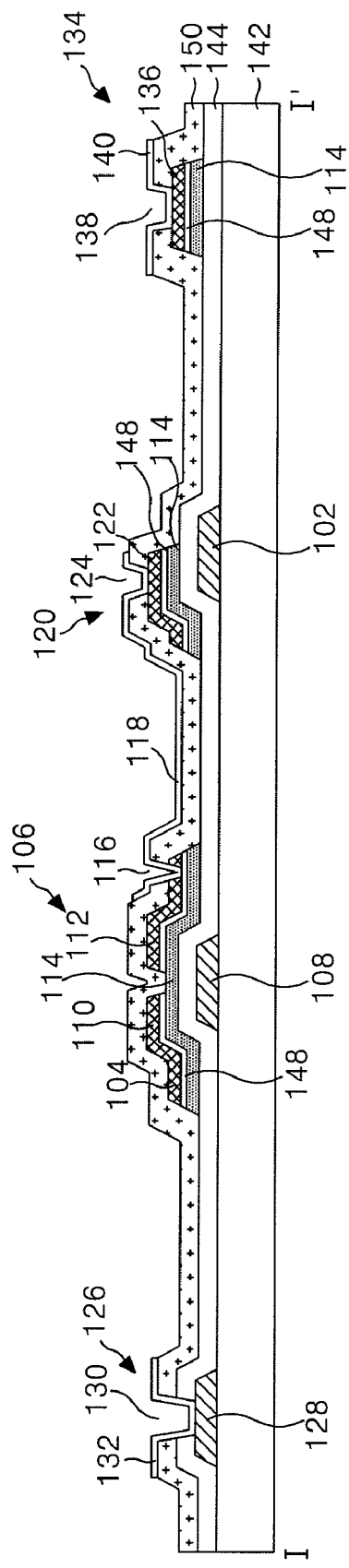

FIGS. 6A and 6B are a plan view and a cross-sectional view of a thin film transistor substrate fabricated by a four-mask process.

The thin film transistor substrate shown in FIGS. 6A and 6B includes a gate line 102 and a data line 104 formed on a lower substrate 142 to cross each other with a gate insulating film 144 therebetween; a thin film transistor 106 formed at each crossing part; and a pixel electrode 118 formed in a cell area provided by the crossing structure. In addition, the thin film transistor substrate includes a storage capacitor 120 formed at an overlapping part of the pixel electrode 118 and a pre-stage gate line 102; a gate pad 126 connected to the gate line 102; and a data pad 134 connected to the data line 104.

The thin film transistor 106 receives a pixel signal supplied to the data line 104 to be applied to the pixel electrode 118 in response to a scan signal supplied to the gate line 102. The thin film transistor 106 includes a gate electrode 108 connected to the gate line 102; a source electrode 110 connected to the data line 104; a drain electrode 112 connected to the pixel electrode 116; and an active layer 114 which overlaps with the gate electrode 108 and forms a channel between the source electrode 110 and the drain electrode 112.

The active layer 114, which overlaps with the source electrode 110 and the drain electrode 112 and includes a channel part between the source electrode 110 and the drain electrode 112, is formed to overlap with the data line 104, a data pad lower electrode 136, a storage electrode 122. An ohmic contact layer 148 is further formed on the active layer 114 to be in ohmic contact with the data line 104, the source electrode 110, the drain electrode 112, the data pad lower electrode 136 and the storage electrode 122.

The pixel electrode 118 is connected to the drain electrode 112 of the thin film transistor 106 through a first contact hole 116 which penetrates a passivation film 150. The pixel electrode 118 generates a potential difference with a common electrode which is formed on an upper substrate (not shown), by a pixel signal applied thereto. The potential difference causes the liquid crystal material, which is located between the thin film transistor substrate and the upper substrate, to rotate by dielectric anisotropy, thereby transmitting the light, which is incident through the pixel electrode 118 from a light source (not shown), to the upper substrate.

The storage capacitor 120 includes a pre-stage gate line 102; a storage upper electrode 122 which overlaps with the gate line 102 with the gate insulating film 144, the active layer 114 and the ohmic contact layer 148; and a pixel electrode 122 which overlaps with the storage upper electrode 122 with the passivation film 150 therebetween and is connected thereto through a second contact hole 124 which penetrates the passivation film 150. The storage capacitor 120 keeps the pixel signal applied to the pixel electrode 18 to be stable until the next pixel signal is charged.

The gate line 102 is connected to a gate driver (not shown) through a gate pad 126. The gate pad 126 includes a gate pad lower electrode 128 extending from the gate line 102; and a gate pad upper electrode 132 connected to the gate pad lower electrode 128 through a third contact hole 130 which penetrates the gate insulating film 144 and the passivation film 150.

The data line 104 is connected to a data driver (not shown) through a data pad 134. The data pad 134 includes a data pad lower electrode 136 extending from the data line 104; and a data pad upper electrode 140 connected to the data pad lower electrode 136 through a fourth contact hole 138 which penetrates the passivation film 150.

The fabricating method of the thin film transistor substrate with such a configuration will be explained in detail through the four-mask process in conjunction with FIGS. 7A to 7F.

Figure 7A:
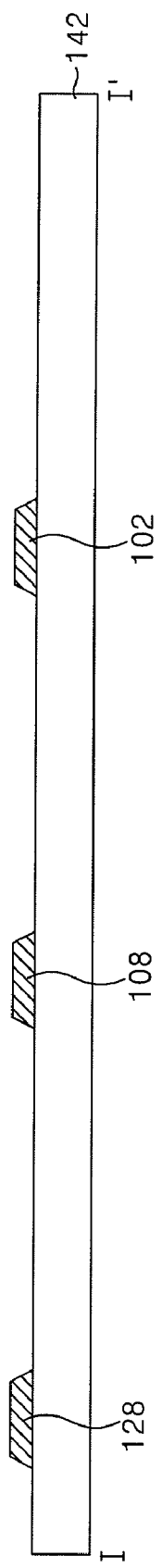

Referring to FIG. 7A, a gate pattern including the gate line 102, the gate electrode 108, the gate pad lower electrode 128 is formed on a lower electrode 142 by a first mask process.

More specifically, a gate metal layer is formed on the lower substrate 142 by a deposition method such as a sputtering method, etc. Subsequently, the gate metal layer is patterned by a photolithography process and an etching process using a first mask, thereby forming a gate pattern including the gate line 102, the gate electrode 108 and the gate pad lower electrode 128. Chrome Cr, molybdenum Mo, aluminum group metal is used as the gate metal in a single or double layer structure.

Figure 7C:
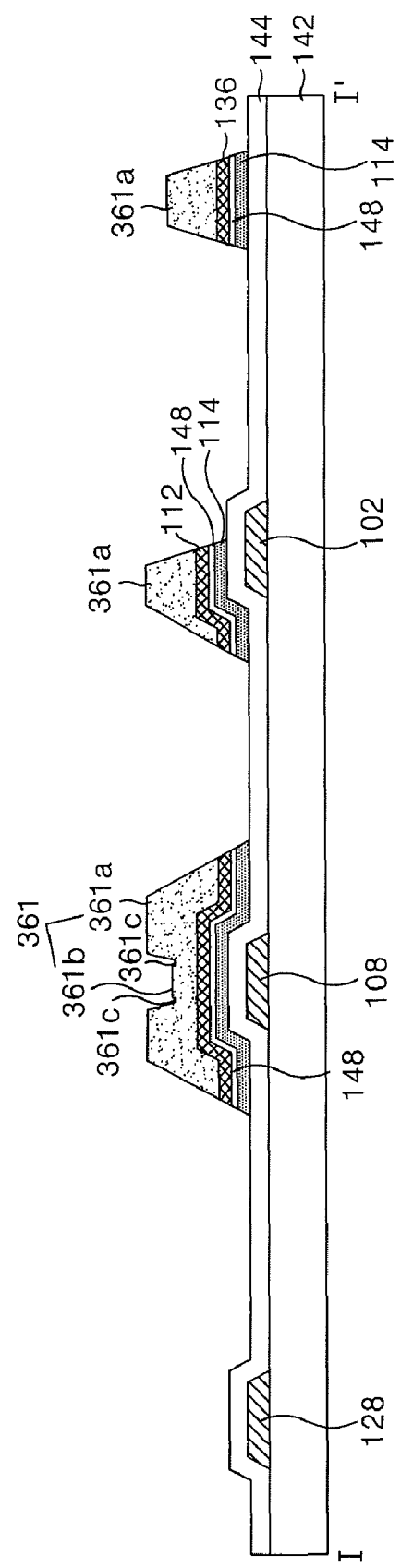

Referring to FIGS. 7B and 7C, the gate insulating film 144 is spread over a lower substrate 142 where the gate pattern is formed. In addition, a semiconductor pattern including the active layer 114 formed of an amorphous silicon layer 114a and the ohmic contact layer 148 formed of an n+ amorphous silicon layer 148a, and a source/drain pattern including the data line 104, the source electrode 110, the drain electrode 112, the data pad lower electrode 136 and the storage electrode 122 are sequentially formed on the gate insulating film 144 by a second mask process.

More specifically, the gate insulating film 144, the amorphous silicon layer 114a, the n+ amorphous silicon layer 148a and the source/drain metal layer 122a are sequentially formed over the lower substrate 142 where the gate pattern is formed, by a deposition method such as PECVD, sputtering, etc. Herein, an inorganic insulating material of silicon oxide SiOx or silicon nitride SiNx is used as a material of the gate insulating film 144. Molybdenum Mo, molybdenum ally, etc are used as the source/drain metal.

A photo-resist 360 is spread over the source/drain metal layer 122a, and a second mask is aligned to the upper part of the thin film transistor substrate 142 over which the photo-resist 360 is spread. A photo-resist pattern 361 is formed by the photolithography process using the second mask. A halftone mask 860a having the halftone transmission pattern 864, 865 of double structure at the channel part of the thin film transistor is used as the second mask, thus a photo-resist pattern 361b of the channel part has a lower height than the other photo-resist pattern part 361a.

More specifically, the halftone mask 860a used as the second mask includes a shielding pattern 862 which is partially formed on the transparent substrate 866; the first halftone transmission pattern 864 which is partially formed on the transparent substrate 866; and the second halftone transmission pattern 865 which is formed on the first halftone transmission pattern 864.

Herein, the shielding pattern 862 is located at an area where the gate pattern is to be formed, to intercept ultraviolet ray UV, thereby leaving the first photo-resist pattern 361a after development. The first and second halftone transmission patterns 864, 865 are located at an area where the storage lower electrode is to be formed, to partially transmit the ultraviolet ray UV, thereby leaving the second photo-resist pattern 361b which is lower than the first photo-resist pattern 361a, after development. At this moment, as shown in FIG. 7C, a resist pattern 361c of a border part of the first photo-resist pattern 361a and the second photo-resist pattern 361b is formed lower than the second photo-resist pattern 361b. This is because the second halftone transmission pattern 865 of the halftone mask 860a fabricated is formed in a narrower area than the first halftone transmission pattern 864. Accordingly, the part where the first halftone transmission pattern 864 overlaps with the second halftone transmission pattern 865 has a lower transmittance than the part which is formed from only the first halftone transmission pattern 864. The resist pattern 361C of the border part formed in the trough has a stepped difference part with a steeper gradient than the pattern formed by the related art. Therefore, no residual photo-resist is left after an ashing process, thereby preventing the pattern of the thin film transistor substrate from being formed non-uniformly.

Subsequently, the source/drain metal layer is patterned by a wet etching process using the photo-resist pattern 361, thereby forming the source/drain pattern including the data line 104, the source electrode 110, the drain electrode 112 integrated with the source electrode 110, and the storage electrode 122.

Subsequently, the n+ amorphous silicon layer and the amorphous silicon layer are simultaneously patterned by a dry etching process using the same photo-resist pattern 361, thereby forming the ohmic contact layer 148 and the active layer 114.

Figure 7D:
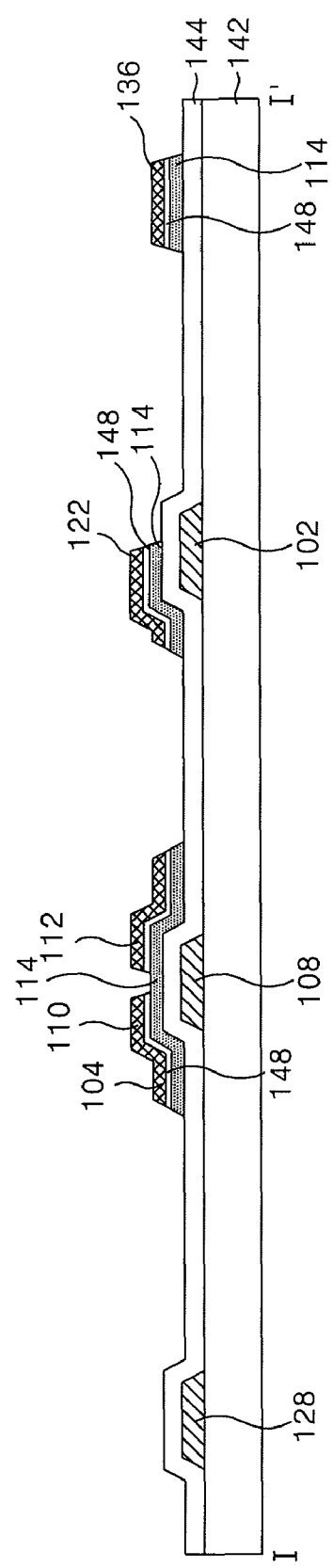

Then, the ohmic contact layer 148 and the source/drain pattern of the channel part are etched by the dry etching process after removing the photo-resist pattern 361b, 361c which have a relatively lower height in the channel part, by the ashing process. Accordingly, as shown in FIG. 7D, the active layer 114 of the channel part is exposed to separate the source electrode 110 and the drain electrode 112.

Subsequently, the photo-resist pattern remaining on the source/drain pattern is removed by a stripping process.

Figure 7E:
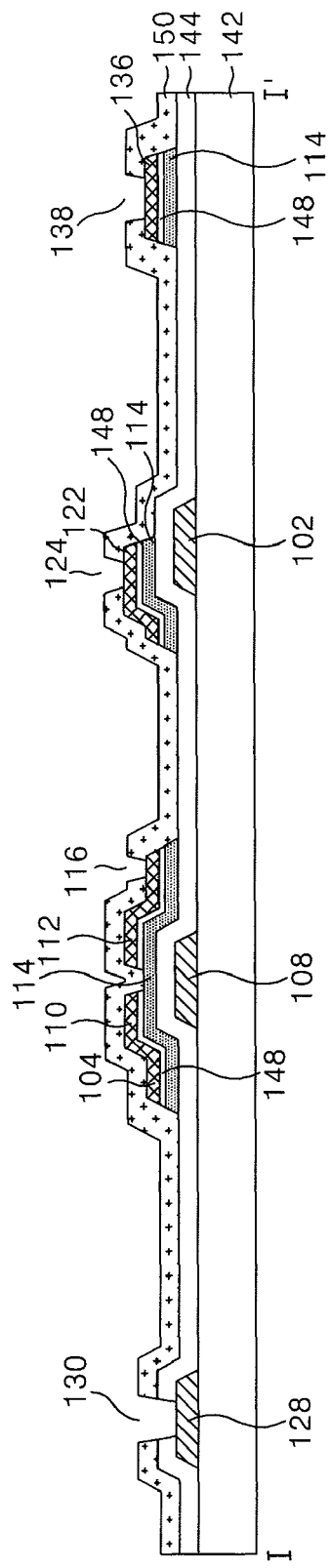

Referring to FIG. 7E, the passivation film 150 including the first to fourth contact holes 116, 124, 130, 138 is formed by a third mask process on the gate insulating film 144 where the source/drain pattern is formed.

More specifically, the passivation film 150 is formed by a method such as PECVD, spin coating, etc on the entire surface of the gate insulating film where the source/drain pattern is formed. Subsequently, the passivation film 150 is patterned by the photolithography process and the etching process using a third mask, thereby forming the first to fourth contact holes 116, 124, 130, 138. The first contact hole 116 is formed to penetrate the passivation film 150 to expose the drain electrode 112, and the second contact hole 124 is formed to penetrate the passivation film 150 to expose the storage upper electrode 122. The third contact hole 130 is formed to penetrate the passivation film 150 and the gate insulating film 144 to expose the gate pad lower electrode 128, and the fourth contact hole 138 is formed to penetrate the passivation film 150 to expose the data pad lower electrode 136.

An inorganic insulating material like the gate insulating film 144 or an organic insulating material such as PFCB, BCB or an acrylic organic compound with low dielectric constant is used as a material of the passivation film 150.

Figure 7F:
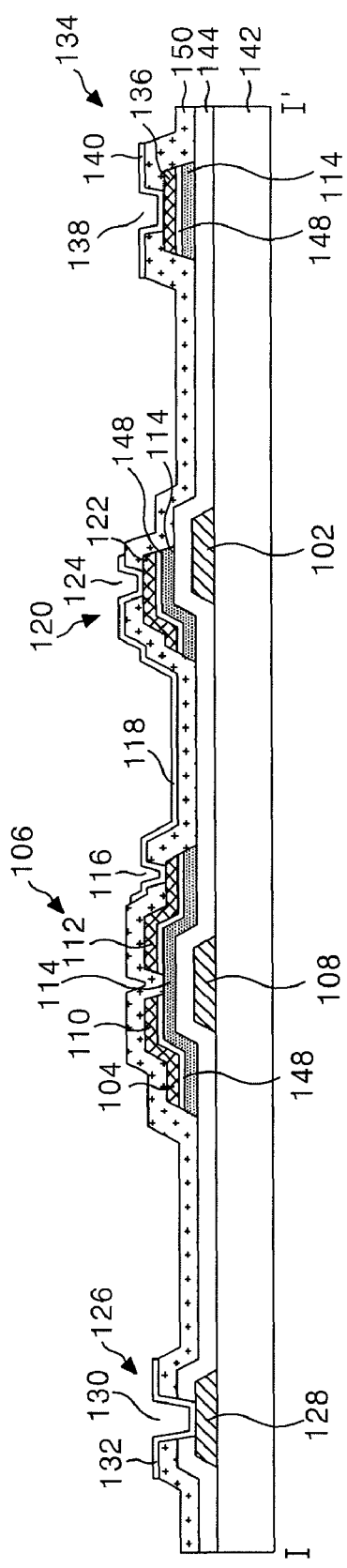

Referring to FIG. 7F, a transparent conductive pattern including the pixel electrode 118, the gate pad upper electrode 132 and the data pad upper electrode 140 is formed on the passivation film 150 by a fourth mask process.

A transparent conductive layer is spread over the passivation film by a deposition method such as sputtering, etc. Subsequently, the transparent conductive layer is patterned by the photolithography process and the etching process using a fourth mask, thereby forming the transparent conductive pattern including the pixel electrode 118, the gate pad upper electrode 132 and the data pad upper electrode 140. The pixel electrode 118 is connected to the drain electrode 112 through the first contact hole 116 and to the storage upper electrode 122, which overlaps with the pre-stage gate line 102, through the second contact hole. The gate pad upper electrode 132 is connected to the gate pad lower electrode 128 through the third contact hole 130, and the data pad upper electrode 140 is connected to the data lower electrode 136 through the fourth contact hole 138. Herein, indium tin oxide ITO is used as a material of the transparent conductive layer.

The halftone mask can also be applied to a three-mask process which is made by using the halftone mask as in Korean Patent Application Nos. 10-2002-1121054, 10-2003-0012320, 10-2003-0002072 which were applied by the Applicant, as well as to the four-mask process.

As described above, the halftone mask according to an embodiment of the present invention has the halftone transmission pattern with a step structure. The light transmittance of the part where the first halftone transmission pattern overlaps with the second halftone transmission pattern becomes lower than the light transmittance of the part which is formed from only the first halftone transmission pattern so that the stepped difference of the photo-resist pattern formed correspondingly thereto is formed to be steeper in gradient.

Accordingly, in the course of fabricating the display device, no residual photo-resist remains so that the precision and the uniformity of the signal and electrode pattern of the display device can be improved.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A halftone mask, comprising:
   shielding parts partially directly formed on a transparent substrate; and
   a halftone transmission pattern formed on the transparent substrate between the shielding parts, the halftone transmission pattern has a step structure including an upper portion and a lower portion, a first width of the upper portion is narrower than a second width of the lower portion,
   wherein the shielding parts are in contact with a border of the lower portion of the halftone transmission pattern; and
   wherein the lower portion of the halftone transmission pattern is partially exposed in a gap between the shielding parts and the upper portion of the halftone transmission pattern, and the transparent substrate is not exposed in the gap.

2. The halftone mask according to claim 1, wherein a light transmittance where the upper and lower portions of the halftone transmission pattern are overlapped is higher than a light transmittance of the shielding parts.

3. The halftone mask according to claim 1, wherein a light transmittance where the lower portion of the halftone transmission pattern is uncovered by the upper portion of the halftone transmission pattern is higher than a light transmittance where the upper and lower portions of the halftone transmission pattern are overlapped.

4. The halftone mask according to claim 1, wherein a light transmittance of the lower portion of the halftone transmission pattern is substantially the same as a light transmittance of the upper portion of the halftone transmission pattern.

5. The halftone mask according to claim 1, wherein a light transmittance of the lower portion of the halftone transmission pattern is different from a light transmittance of the upper portion of the halftone transmission pattern.

* * * * *

UNITED STATES PATENT AND TRADEMARK OFFICE
CERTIFICATE OF CORRECTION

PATENT NO.       : 8,318,390 B2  
APPLICATION NO.  : 13/243936  
DATED            : November 27, 2012  
INVENTOR(S)      : Ji No Lee It is certified that error appears in the above-identified patent and that said Letters Patent is hereby corrected as shown below:

ON THE TITLE PAGE and IN THE SPECIFICATION:

At item (54) of the Title Page and in Column 1, at lines 1-4, correct the title to read as follows:

--HALFTONE MASK HAVING SHIELDING PARTS AND PLURAL OVERLAPPING HALFTONE PATTERNS OF DIFFERENT WIDTHS--.

Signed and Sealed this  
Twenty-sixth Day of February, 2013

Teresa Stanek Rea  
*Acting Director of the United States Patent and Trademark Office*